US012237158B2

United States Patent
Panda et al.

(10) Patent No.: US 12,237,158 B2
(45) Date of Patent: Feb. 25, 2025

(54) ETCH FEEDBACK FOR CONTROL OF UPSTREAM PROCESS

(71) Applicant: Applied Materials, Inc., Santa Clara, CA (US)

(72) Inventors: Priyadarshi Panda, Newark, CA (US); Lei Lian, Fremont, CA (US); Leonard Michael Tedeschi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 906 days.

(21) Appl. No.: 17/103,845

(22) Filed: Nov. 24, 2020

(65) Prior Publication Data

US 2022/0165541 A1 May 26, 2022

(51) Int. Cl.
*H01L 21/66* (2006.01)
*H01J 37/32* (2006.01)

(52) U.S. Cl.
CPC .... *H01J 37/3299* (2013.01); *H01J 37/32926* (2013.01); *H01L 22/26* (2013.01); *H01J 2237/332* (2013.01); *H01J 2237/3341* (2013.01)

(58) Field of Classification Search
CPC ............. H01J 37/3299; H01J 37/32926; H01J 2237/332; H01J 2237/3341; H01L 22/26;
(Continued)

(56) References Cited

U.S. PATENT DOCUMENTS 6,304,999 B1    10/2001   Toprac et al.
6,947,803 B1     9/2005   Bode et al.
(Continued)

FOREIGN PATENT DOCUMENTS

CN    101313308 A    11/2008
CN    111587478 A     8/2020
(Continued)

OTHER PUBLICATIONS

International Search Report and Written Opinion for International Application No. PCT/US2021/059971 mailed Mar. 14, 2022, 12 pages.
(Continued)

*Primary Examiner* — Eyob Hagos
(74) *Attorney, Agent, or Firm* — Lowenstein Sandler LLP

(57) ABSTRACT

A substrate processing system comprises an etch chamber configured to perform an etch process on a substrate, the etch chamber comprising an optical sensor to generate one or more optical measurements of a film on the substrate during and/or after the etch process. The system further comprises a computing device operatively connected to the etch chamber, wherein the computing device is to: receive the one or more optical measurements of the film; determine, for each optical measurement of the one or more optical measurements, a film thickness of the film; determine an etch rate of the film based on the one or more optical measurements using the determined film thickness of each optical measurement of the one or more optical measurements; and determine a process parameter value of at least one process parameter for a previously performed process that was performed on the substrate based on the etch rate.

14 Claims, 9 Drawing Sheets

(58) Field of Classification Search
CPC ............... H01L 22/12; H01L 21/67184; H01L 21/67253; H01L 21/67069
See application file for complete search history.

(56) References Cited

U.S. PATENT DOCUMENTS

| | | | |
|---|---|---|---|
| 7,498,106 | B2 | 3/2009 | Mui et al. |
| 7,894,927 | B2 | 2/2011 | Funk et al. |
| 9,972,478 | B2 | 5/2018 | Guha et al. |
| 9,978,621 | B1 * | 5/2018 | Kraus ..................... H01L 22/26 |
| 10,032,681 | B2 | 7/2018 | Bailey, III et al. |
| 10,262,910 | B2 | 4/2019 | Feng et al. |
| 10,529,602 | B1 | 1/2020 | Panda et al. |
| 10,579,041 | B2 | 3/2020 | Nurani et al. |
| 11,709,477 | B2 | 7/2023 | Panda et al. |
| 2003/0090676 | A1 | 5/2003 | Goebel et al. |
| 2004/0110375 | A1 | 6/2004 | Chen et al. |
| 2005/0085090 | A1 | 4/2005 | Mui et al. |
| 2005/0098535 | A1 * | 5/2005 | Lansford ........... H01L 21/67253 |
| | | | 216/59 |
| 2005/0115824 | A1 | 6/2005 | Donohue et al. |
| 2007/0169694 | A1 | 7/2007 | Schwarm et al. |
| 2007/0249071 | A1 | 10/2007 | Lian et al. |
| 2009/0083013 | A1 | 3/2009 | Li |
| 2009/0277872 | A1 | 11/2009 | Yamamoto et al. |
| 2012/0248061 | A1 * | 10/2012 | Brown ............... H01L 21/30612 |
| | | | 156/345.11 |
| 2015/0099314 | A1 | 4/2015 | Saraf et al. |
| 2015/0311129 | A1 | 10/2015 | Miller et al. |
| 2016/0111307 | A1 | 4/2016 | Davis |
| 2016/0181116 | A1 | 6/2016 | Berry et al. |
| 2017/0098565 | A1 | 4/2017 | Lu et al. |
| 2017/0256463 | A1 * | 9/2017 | Bailey, III .......... H01L 21/3065 |
| 2018/0061721 | A1 | 3/2018 | Khaja |
| 2018/0082201 | A1 | 3/2018 | Cantwell |
| 2018/0114711 | A1 | 4/2018 | Budiarto et al. |
| 2018/0150052 | A1 | 5/2018 | Cherian |
| 2018/0304435 | A1 | 10/2018 | Xu et al. |
| 2018/0350699 | A1 * | 12/2018 | Gellineau ........... G03F 7/70525 |
| 2019/0072482 | A1 | 3/2019 | Feng et al. |
| 2019/0095797 | A1 | 3/2019 | Dhandapani et al. |
| 2019/0171181 | A1 | 6/2019 | Nurani et al. |
| 2019/0237337 | A1 | 8/2019 | Matsui et al. |
| 2019/0244870 | A1 | 8/2019 | Feng et al. |
| 2019/0252163 | A1 | 8/2019 | Gottscho |
| 2019/0259674 | A1 | 8/2019 | Howald et al. |
| 2019/0299356 | A1 | 10/2019 | Xu et al. |
| 2019/0348312 | A1 | 11/2019 | Kommisetti et al. |
| 2020/0006100 | A1 | 1/2020 | Clark et al. |
| 2020/0083074 | A1 * | 3/2020 | Clark ................. H01L 21/67276 |
| 2020/0083080 | A1 | 3/2020 | Clark et al. |
| 2020/0227294 | A1 | 7/2020 | Zhu et al. |
| 2020/0243359 | A1 | 7/2020 | Hao et al. |
| 2020/0388545 | A1 | 12/2020 | Honda et al. |
| 2021/0080941 | A1 | 3/2021 | Entzminger et al. |
| 2022/0171373 | A1 | 6/2022 | Chau et al. |
| 2022/0344184 | A1 | 10/2022 | Sadeghi |

FOREIGN PATENT DOCUMENTS

| | | | |
|---|---|---|---|
| JP | H1064886 | A | 3/1998 |
| JP | 2003083720 | A | 3/2003 |
| JP | 2003209035 | A | 7/2003 |
| JP | 2003554661 | A | 11/2003 |
| JP | 2005129906 | A | 5/2005 |
| JP | 2005514790 | A | 5/2005 |
| JP | 2018056465 | A * | 4/2018 |
| JP | 2020053506 | A | 4/2020 |
| JP | 2020070470 | A | 5/2020 |
| JP | 2020136568 | A | 8/2020 |
| JP | 2020155526 | A | 9/2020 |
| JP | 2022045906 | A | 3/2022 |
| KR | 20080044130 | A | 5/2008 |
| KR | 20090012297 | A | 2/2009 |
| KR | 20160046310 | A | 4/2016 |
| KR | 20160075358 | A | 6/2016 |
| KR | 101909477 | B1 | 10/2018 |
| KR | 20200112584 | A | 10/2020 |
| WO | 2016190905 | A1 | 12/2016 |
| WO | 2019182913 | A1 | 9/2019 |
| WO | 2019182916 | A1 | 9/2019 |
| WO | 2019217348 | A1 | 11/2019 |
| WO | 2020159673 | A1 | 8/2020 |
| WO | 2020205339 | A1 | 10/2020 |
| WO | 2021030833 | A1 | 2/2021 |
| WO | 2021231138 | A1 | 11/2021 |
| WO | 2021261352 | A1 | 12/2021 |

OTHER PUBLICATIONS

International Preliminary Report on Patentability for International Application No. PCT/US2021/059971, mailed Jun. 8, 2023, 9 Pages.

International Preliminary Report on Patentability for International Application No. PCT/US2021/060130, mailed Jun. 8, 2023, 7 Pages.

International Search Report and Written Opinion for International Application No. PCT/US2021/060130, mailed Mar. 21, 2022, 10 pages.

International Search Report and Written Opinion for International Application No. PCT/US2022/011316, mailed Apr. 22, 2022, 14 Pages.

Extended European Search Report for European Application No. 21898948.1, mailed Dec. 5, 2024, 10 Pages.

* cited by examiner

ETCH FEEDBACK FOR CONTROL OF UPSTREAM PROCESS

TECHNICAL FIELD

Embodiments of the present disclosure relate to feedback control of an upstream process based on sensor measurements generated during an etch process.

BACKGROUND

To develop a manufacturing process sequence to form components on a substrate, engineers will perform one or more designs of experiments (DoEs) to determine process parameter values to use for each process in the manufacturing process sequence. For the DoEs, multiple different process parameter values are generally tested by processing substrates using the different process parameter values for each manufacturing process. This includes performing destructive measurements of the substrates, which destroys the substrates. Once the process parameter values are determined, substrates will be processed according to the manufacturing process sequence, where predetermined process parameter values that were determined based on an outcome of the DoEs are used for each process in the manufacturing process sequence. An engineer then expects processed substrates to have similar properties to those of substrates that were processed during the DoEs. However, there is often variation between film properties determined during a DoE and film properties of films on product substrates. Additionally, each process chamber may be slightly different from other process chambers, and may generate films having different film properties. Moreover, process chambers may change over time, causing films generated by those process chambers to also change over time, even if the same process recipe is used.

Occasionally, a non-product substrate (also referred to as a dummy wafer) may be processed using the predetermined process parameter values for a process, and the processed substrate may be measured using the same destructive measurement techniques used during the DoEs to determine whether the designed processes are performing as anticipated. However, processing a non-product substrate takes time during which a process chamber is not being used to process product substrates. Additionally, performing the destructive measurements also takes time and personnel resources.

SUMMARY

Some of the embodiments described herein cover a substrate processing system comprising an etch chamber and a computing device operatively connected to the etch chamber. The etch chamber is configured to perform an etch process on a substrate, and comprises an optical sensor to generate one or more optical measurements of a film on the substrate at least one of during the etch process or after the etch process. The computing device receives the one or more optical measurements of the film. The computing device determines, for each optical measurement of the one or more optical measurements, a film thickness of the film. The computing device determines an etch rate of the film based on the one or more optical measurements using the determined film thickness of each optical measurement of the one or more optical measurements. The computing device determines a process parameter value of at least one process parameter for a previously performed process that was performed on the substrate based on the etch rate. The determined process parameter value of the at least one process parameter may be used to adjust the at least one process parameter for future substrates.

In additional or related embodiments, a method comprises performing an etch process to etch a film on a substrate, wherein the film was previously formed on the substrate using a deposition process; generating one or more optical measurements of the film on the substrate at least one of during the etch process or after the etch process; determining, for each optical measurement of the one or more optical measurements, a film thickness of the film; determining an etch rate of the film based on the one or more optical measurements using the determined film thickness of each optical measurement of the one or more optical measurements; and determining a process parameter value of at least one process parameter for the deposition process that was performed on the substrate based on the etch rate.

In some embodiments, a method comprises receiving or generating a training dataset comprising a plurality of data items, each data item of the plurality of data items comprising a process parameter value of at least one process parameter used for a manufacturing process that forms a film on a substrate, a film quality value of the film formed by the manufacturing process performed using the process parameter value of the at least one process parameter, and an etch rate of an etch process used to etch the film. The method further comprises training, based on the training dataset, a model takes an etch rate as an input to output at least one of a predicted film quality value or a predicted process parameter value of at least one process parameter based on the etch rate.

Numerous other features are provided in accordance with these and other aspects of the disclosure. Other features and aspects of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1A:
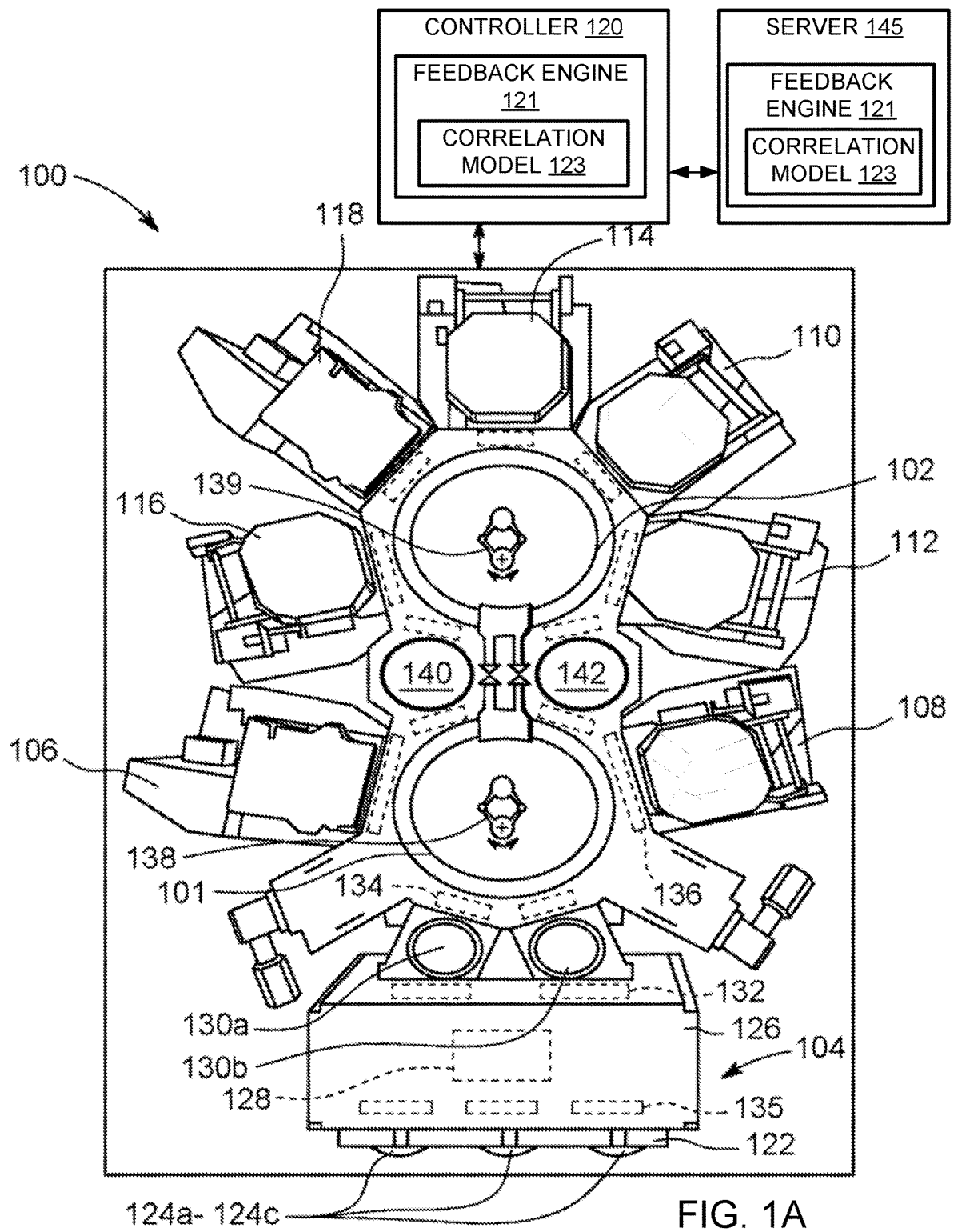
FIG. 1A is a top schematic view of a first example manufacturing system, according to an embodiment.

Embodiments described herein relate to methods of using etch rate of a film determined from an etch process to determine one or more properties of the film and/or to determine process parameter values of one or more process parameters of an upstream manufacturing process that was performed to form the film. Embodiments additionally relate to a manufacturing system that implements the methods described herein. Embodiments further relate to methods of training a model to correlate etch rate of a film to one or more properties of the film and/or to process parameter values of one or more upstream manufacturing processes performed to form the film. The model may be a machine learning model or a regression model, for example. Examples of models that may be trained include linear regression models, Gaussian regression models and neural networks, such as convolutional neural networks.

Traditionally, a one-time DoE is performed to determine the recipe set points for process parameters of a manufacturing process (e.g., of a deposition process). Once the recipe set points are configured for a recipe, each process chamber that runs that recipe uses the determined process parameter set points, and an assumption is made that the film quality that was determined at the time of the DoE is being achieved for the manufacturing process. However, often there are variations between process chambers and/or process parameters of process chambers drift over time. Such variations and/or drift causes those process chambers to achieve different process parameter values than those that are actually set in the process recipe. For example, a process recipe for a manufacturing process may include a target temperature to 200° C., but a first process chamber may actually achieve a real temperature of 205° C. when set to 200° C. Additionally, a second process chamber may actually achieve a real temperature of 196° C. when set to 200° C. Such deviations from the predetermined process parameter values of the process recipe can cause one or more properties of a film deposited using the manufacturing process to vary from target properties. For example, increases in temperature may increase a grain size of a film and decreases in temperature may decrease a grain size of a film. The film may be one layer of devices that are ultimately formed, and such changes in the properties of the film can have detrimental effects on the devices that are ultimately formed.

Measurement techniques such as X-ray diffraction (XRD), transmission electron microscopy (TEM), atomic force microscopy (AFM) and so on that can be used to measure properties of films that indicate film quality are destructive measurement techniques that destroy the substrate on which the measurement is performed. Moreover, such measurement techniques are generally very time consuming. Accordingly, measurements that provide information on film quality are not performed on substrates containing product (e.g., product wafers). Accordingly, as discussed above an assumption is generally made that the films formed using the process recipes have a target film quality (e.g., target film properties).

One technique that may be used to address the issue of process chamber variations and drift is to periodically perform a manufacturing process in question on a dummy or non-product substrate in a process chamber. The substrate with the film is then tested using a destructive metrology technique such as XRD, TEM or AFM to determine characteristics of the film and to confirm that the film has a target film quality. However, while the manufacturing process is being performed on the dummy substrate by a process chamber, product substrates cannot be processed by the process chamber. Additionally, there is a delay between processing of the substrate using the manufacturing process and when results of the metrology measurements are obtained. During this delay, a manufacturer may choose to continue to run product substrates on the process chamber (risking forming films with inferior quality) or may choose to wait for the results of the metrology measurements (causing a further delay to the manufacturing line). Both options increase the cost of manufacturing.

Embodiments provide a system and method of monitoring film quality of films using optical sensors of etch process chambers. Optical measurements are taken of a film during and/or after an etch process (e.g., in an in-line manner) using the optical sensors of the etch chambers. The optical measurements are correlated to film quality of a film and/or to process parameter values of one or more process parameters of an upstream manufacturing process used to form the film. Measurements can be performed on each substrate as it is etched, providing measurement data on a substrate-by-substrate (e.g., wafer-by-wafer) level. Measurements are performed much more quickly than traditional measurements used to assess the quality of films, and are performed without damaging the product substrates. Moreover, measurements of film quality may be performed in-situ during etching and without increasing the manufacturing time for a device and without reducing the amount of time that process chambers are available to process product substrates. If a problem is discovered in a film of a substrate, the process chamber that performed the upstream manufacturing process can be adjusted and/or scheduled for maintenance with few or no other product substrates being processed under the same conditions that caused the problem. Accordingly, an etch chamber becomes an in-line metrology tool for providing feedback control of upstream film formation (e.g., deposition) processes in embodiments.

In an example, an etch chamber can be used as an in-line metrology tool for providing feedback control of a DRAM bit line deposition (e.g., a Ruthenium (Ru) bit line deposition). The Ru bit line resistance may be dependent on a tradeoff between grain size and average surface roughness. With a centered process for Ru deposition conditions (e.g., crystal characteristics and/or grain characteristics), in order to maintain minimal run-to-run variation in the electrical resistance, grain size may be monitored and controlled in embodiments. The grain size may be correlated to deposition temperature for Ru deposition, and may be further correlated to etch rate. These correlations may be made to generate a trained model that receives an etch rate as an input and outputs a film quality value (e.g., representative of a grain size and/or electrical resistance) and/or an Ru deposition temperature. Accordingly, the measured Ru etch rate may be used to perform feedback control of grain size by adjusting the Ru deposition temperature.

In one embodiment, an etch chamber is configured to perform an etch process on a substrate, and comprises an optical sensor to generate one or more optical measurements of a film on the substrate at least one of during the etch process or after the etch process. The computing device receives the one or more optical measurements of the film and determines, for each optical measurement of the one or more optical measurements, a film thickness of the film. The computing device determines an etch rate of the film based on the one or more optical measurements using the determined film thickness of each optical measurement of the one or more optical measurements. The computing device determines a film quality value for the film and/or a process parameter value of at least one process parameter for a previously performed process that was performed on the substrate based on the etch rate. The determined process parameter value of the at least one process parameter may be used to adjust the at least one process parameter for future substrates and/or to schedule the process chamber for maintenance.

Referring now to the figures, FIG. 1A is a diagram of a cluster tool 100 (also referred to as a system or manufacturing system) that is configured for substrate fabrication, e.g., post poly plug fabrication, in accordance with at least some embodiments of the disclosure. The cluster tool 100 includes one or more vacuum transfer chambers (VTM) 101, 102, a factory interface 104, a plurality of processing chambers/modules 106, 108, 110, 112, 114, 116, and 118, and a process controller 120 (controller). A server computing device 145 may also be connected to the cluster tool 100 (e.g., to the controller 120 of the cluster tool 100). In embodiments with more than one VTM, such as is shown in FIG. 1A, one or more pass-through chambers (referred to as vias) may be provided to facilitate vacuum transfer from one VTM to another VTM. In embodiments consistent with that shown in FIG. 1A, two pass-through chambers can be provided (e.g., pass-through chamber 140 and pass-through chamber 142).

The factory interface 104 includes a loading port 122 that is configured to receive one or more substrates, for example from a front opening unified pod (FOUP) or other suitable substrate containing box or carrier, that are to be processed using the cluster tool 100. The loading port 122 can include one or multiple loading areas 124a-124c, which can be used for loading one or more substrates. Three loading areas are shown. However, greater or fewer loading areas can be used.

The factory interface 104 includes an atmospheric transfer module (ATM) 126 that is used to transfer a substrate that has been loaded into the loading port 122. More particularly, the ATM 126 includes one or more robot arms 128 (shown in phantom) that are configured to transfer the substrate from the loading areas 124a-124c to the ATM 126, through doors 135 (shown in phantom, also referred to as slit valves) that connects the ATM 126 to the loading port 122. There is typically one door for each loading port (124a-124c) to allow substrate transfer from respective loading port to the ATM 126. The robot arm 128 is also configured to transfer the substrate from the ATM 126 to load locks 130a, 130b through doors 132 (shown in phantom, one each for each load lock) that connect the ATM 126 to the air locks 130a, 130b. The number of load locks can be more or less than two but for illustration purposes only, two load locks (130a and 130b) are shown with each load lock having a door to connect it to the ATM 126. Load locks 130a-b may or may not be batch load locks.

The load locks 130a, 130b, under the control of the controller 120, can be maintained at either an atmospheric pressure environment or a vacuum pressure environment, and serve as an intermediary or temporary holding space for a substrate that is being transferred to/from the VTM 101, 102. The VTM 101 includes a robot arm 138 (shown in phantom) that is configured to transfer the substrate from the load locks 130a, 130b to one or more of the plurality of processing chambers 106, 108 (also referred to as process chambers), or to one or more pass-through chambers 140 and 142 (also referred to as vias), without vacuum break, i.e., while maintaining a vacuum pressure environment within the VTM 102 and the plurality of processing chambers 106, 108 and pass-through chambers 140 and 142. The VTM 102 includes a robot arm 138 (in phantom) that is configured to transfer the substrate from the air locks 130a, 130b to one or more of the plurality of processing chambers 106, 108, 110, 112, 114, 116, and 118, without vacuum break, i.e., while maintaining a vacuum pressure environment within the VTM 102 and the plurality of processing chambers 106, 108, 110, 112, 114, 116, and 118.

A door 134, e.g., a slit valve door, connects each respective load lock 130a, 130b, to the VTM 101. Similarly, a door 136, e.g., a slit valve door, connects each processing module to the VTM to which the respective processing module is coupled (e.g., either the VTM 101 or the VTM 102). The plurality of processing chambers 106, 108, 110, 112, 114, 116, and 118 are configured to perform one or more processes. Examples of processes that may be performed by one or more of the processing chambers 106, 108, 110, 112, 114, 116, and 118 include cleaning processes (e.g., a pre-clean process that removes a surface oxide from a substrate), anneal processes, deposition processes (e.g., for deposition of a cap layer, a hard mask layer, a barrier layer, a bit line metal layer, a barrier metal layer, etc.), etch processes, and so on. Examples of deposition processes that may be performed by one or more of the process chambers include physical vapor deposition (PVD), chemical vapor deposition (CVD), atomic layer deposition (ALD), and so on. Examples of etch processes that may be performed by one or more of the process chambers include plasma etch processes. In one example embodiment, the process chambers 106, 108, 110, 112, 114, 116, and 118 are configured to perform processes that are typically associated with a post poly plug fabrication sequence and/or a dynamic random-access memory (DRAM) bit line stack fabrication sequence.

Controller 120 (e.g., a tool and equipment controller) may control various aspects of the cluster tool 100, e.g., gas pressure in the processing chambers, individual gas flows, spatial flow ratios, plasma power in various process chambers, temperature of various chamber components, radio frequency (RF) or electrical state of the processing chambers, and so on. The controller 120 may receive signals from and send commands to any of the components of the cluster tool 100, such as the robot arms 128, 138, process chambers 106, 108, 110, 112, 114, 116, and 118, load locks 130a-b, slit valve doors, one or more sensors, and/or other processing components of the cluster tool 100. The controller 120 may thus control the initiation and cessation of processing, may adjust a deposition rate, a type or mix of deposition composition, an etch rate, and the like. The controller 120 may further receive and process measurement data (e.g., optical measurement data) from various sensors (e.g., optical sensors).

In various embodiments, the controller 120 may be and/or include a computing device such as a personal computer, a server computer, a programmable logic controller (PLC), a microcontroller, and so on. The controller 120 may include (or be) one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 120 may include a data storage device (e.g., one or more disk drives and/or solid state drives), a main memory, a static memory, a network interface, and/or other components. The processing device of the controller 120 may execute instructions to perform any one or more of the methodologies and/or embodiments described herein. The instructions may be stored on a computer readable storage medium, which may include the main memory, static memory, secondary storage and/or processing device (during execution of the instructions).

In one embodiment, the controller 120 includes a feedback engine 121. The feedback engine may be implemented in hardware, firmware, software, or a combination thereof. The feedback engine 121 is configured to receive and process optical measurement data, optionally including the results of reflectometry performed by an optical sensor such as a spectrometer. The feedback engine 121 may calculate the optical measurement data (e.g., a reflectometry signal) during etching of a substrate to determine one or more thickness values of the substrate. The feedback engine 121 may further determine an etch rate based on time stamps of when the optical measurements were made and the change in thickness between those optical measurements.

In one embodiment, feedback engine 121 includes a correlation model 123 that correlates the etch rate to a film quality value. The film quality value may be a value associated with one or more properties of the film. Examples of the properties that may be correlated with the etch rate are grain size (e.g., grain size in the Z direction profile), grain orientation, crystal structure, thickness, and average surface roughness (Ra). During a DoE, a determination may have been made of optimal film properties, and a highest film quality value may be assigned to a particular combination of film property values. Additional lower film quality values may have been assigned to other combinations of film quality values. Alternatively, an intermediate film quality value may be assigned to a particular combination of film property values that indicate a highest quality film. Film quality values above and below the intermediate film quality value may be assigned for other combinations of film properties that result in inferior film quality. The correlation model 123 may additionally or alternatively correlate the etch rate and/or the film quality values to a process parameter value of a process parameter (process parameter values of multiple process parameters) that was used during a prior upstream manufacturing process used to form the film that is etched during the etch process.

Feedback engine 121 may input the determined etch rate into the correlation model 123, and may receive as an output a film quality value of a film being etched and/or one or more process parameter values of one or more process parameters of the prior upstream manufacturing process used to form the film under etch. Feedback engine 121 may compare the determined process parameter value or values to target process parameter value(s) associated with a process recipe of the manufacturing process used to form the film. If a difference is identified between the determined process parameter value(s) and the target process parameter value(s), feedback engine may generate a process parameter value offset for the process chamber in question that processed the substrate to form the film. Thereafter, the process chamber will apply the process parameter offset to the target process parameter value in the process recipe when performing the manufacturing process of the process recipe on subsequent substrates that are processed. This increases an accuracy and/or precision of the properties of the films formed using the process recipe. Additionally, or alternatively, feedback engine 121 may schedule the process chamber for maintenance responsive to determining that the difference exceeds a difference threshold.

In an example, a first one of the process chambers 106, 108, 110, 112, 114, 116, and 118 may be a deposition chamber and a second one of the process chamber 106, 108, 110, 112, 114, 116, and 118 may be an etch chamber. The deposition chamber may execute a process recipe to deposit a film on a substrate. This may include using target process parameter values of one or more process parameters such as temperature, pressure, plasma power, and so on during the deposition process. The etch chamber may then process the substrate with the film after the film has been deposited on the substrate by the deposition chamber. The etch chamber may etch the film, and may generate optical measurements of the film during the etch process and/or at a beginning and ending of the etch process. The controller 120 may receive the optical measurements, and feedback engine 121 may compute the etch rate at one or more depths/thicknesses of the film and/or may compute an overall etch rate of the film. The feedback engine 121 may determine that the etch rate is higher or lower than at target etch rate (which is an etch rate that correlates to a highest possible film quality value), and may determine process parameter values of one or a combination of process parameters that correlate to the determined etch rate. The controller 120 may then adjust the settings of the deposition chamber (e.g., via generation of one or more process parameter offsets for the deposition chamber). When the deposition chamber processes future substrates using the process recipe to deposit the film on the future substrates, the determined adjustment or offset is applied to the one or more process parameter values set in the process recipe. The resulting films then have film properties that more closely resemble ideal film properties (e.g., the films have a higher film quality value or film quality value closer to an ideal film quality value).

Controller 120 may be operatively connected to server 145. Server 145 may be or include a computing device that operates as a factory floor server that interfaces with some or all tools in a fabrication facility. Server 145 may send instructions to controllers of one or more cluster tools, such as cluster tool 100. For example, server 145 may receive signals from and send commands to controller 120 of cluster tool 100.

In various embodiments, the server 145 may be and/or include a computing device such as a personal computer, a server computer, a programmable logic controller (PLC), a microcontroller, and so on. The server 145 may include (or be) one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The server 145 may include a data storage device (e.g., one or more disk drives and/or solid state drives), a main memory, a static memory, a network interface, and/or other components. The processing device of the server 145 may execute instructions to perform any one or more of the methodologies and/or embodiments described herein. The instructions may be stored on a computer readable storage medium, which may include the main memory, static memory, secondary storage and/or processing device (during execution of the instructions).

In some embodiments, server 145 include feedback engine 121 and correlation model 123. Server 145 may include feedback engine 121 and correlation model 123 in addition to or instead of controller 120 including feedback engine 121 and correlation model 123. In some embodiments, controller 120 and/or server 145 correspond to computing device 700 of FIG. 7.

In some instances, one or more processes may be performed on a substrate in a first cluster tool (e.g., cluster tool 100) to form one or more films on the substrate, and one or more etch processes may be performed on the substrate in another cluster tool (e.g., optionally after performing a lithography process on the substrate). In such an example, optical measurements performed for an etch process in a process chamber of the second cluster tool may be used to adjust parameter values for one or more process parameters used by a process chamber of the first cluster tool for future deposition processes. In such an embodiment, server 145 may communicate with controllers of both cluster tools to coordinate the etch feedback control of the process chamber in the first cluster tool based on measurements performed in the second cluster tool.

Figure 1B:
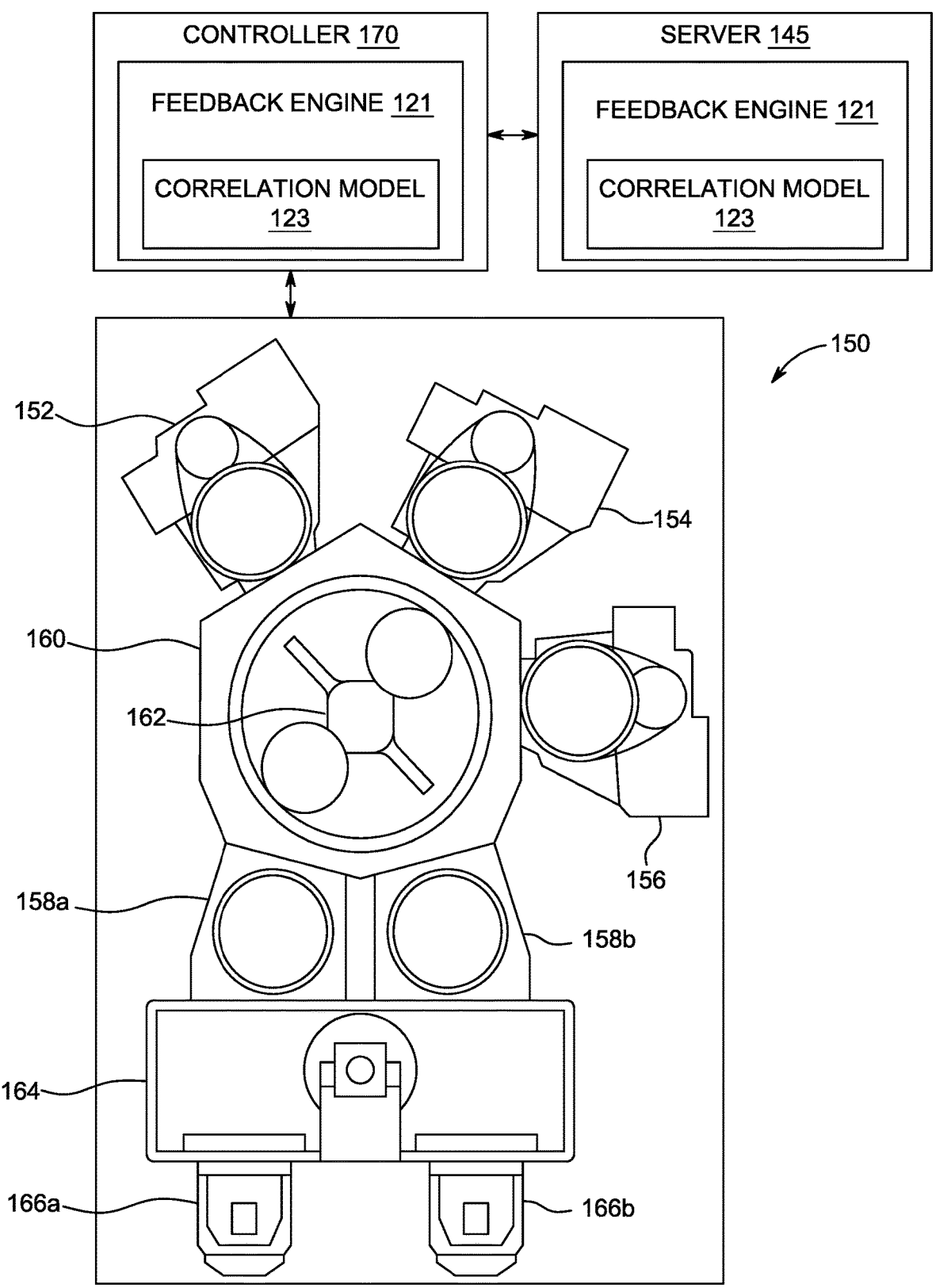
FIG. 1B is a top schematic view of a second manufacturing system, according to an embodiment.

FIG. 1B is a diagram of a cluster tool 150 that is configured for substrate fabrication, e.g., post poly plug fabrication, in accordance with at least some embodiments of the disclosure. The cluster tool 150 includes a vacuum transfer chamber (VTM) 160, a factory interface 164, a plurality of processing chambers/modules 152, 154, 156, and a controller 170. Server computing device 145 may also be connected to the cluster tool 150 (e.g., to the controller 170 of the cluster tool 150).

The factory interface 164 includes one or more loading port that is configured to receive one or more substrates, for example from a front opening unified pod (FOUP) 166a, 166b or other suitable substrate containing box or carrier, that are to be processed using the cluster tool 150.

The factory interface 164 includes an atmospheric transfer module (ATM) that is used to transfer a substrate that has been loaded into the loading port. More particularly, the ATM includes one or more robot arms that are configured to transfer the substrate from loading areas to the ATM, through that connect the ATM to the loading port. The robot arm is also configured to transfer the substrate from the ATM to load locks 158a-b through doors that connect the ATM to the load locks 158a-b. The load locks 158a-b, under the control of the controller 170, can be maintained at either an atmospheric pressure environment or a vacuum pressure environment, and serve as an intermediary or temporary holding space for a substrate that is being transferred to/from the VTM 160. The VTM 160 includes a robot arm 162 that is configured to transfer the substrate from the load locks 158a-b to one or more of the plurality of processing chambers 152, 154, 156, without vacuum break, i.e., while maintaining a vacuum pressure environment within the VTM 160 and the plurality of processing chambers 152, 154, 156.

Controller 170 (e.g., a tool and equipment controller) may control various aspects of the cluster tool 150, e.g., gas pressure in the processing chambers, individual gas flows, spatial flow ratios, temperature of various chamber components, radio frequency (RF) or electrical state of the processing chambers, and so on. The controller 170 may receive signals from and send commands to any of the components of the cluster tool 150, such as the robot arms 162, process chambers 152, 154, 156, load locks 158a-b, slit valve doors, one or more sensors, and/or other processing components of the cluster tool 150. The controller 170 may thus control the initiation and cessation of processing, may adjust a deposition rate, a type or mix of deposition composition, an etch rate, and the like. The controller 170 may further receive and process measurement data (e.g., optical measurement data) from various sensors (e.g., optical sensors of etch process chambers, which may correspond to process chamber 152 and/or process chamber 154). The controller 170 may be substantially similar to controller 120 of FIG. 1A, and may include a feedback engine 121 (e.g., that may include a correlation model 123).

Controller 170 may be operatively connected to server 145, which may also be operatively connected to controller 120 of FIG. 1A.

In an example, one or more processes are performed on a substrate by various process chambers 106, 116, 118, 114, 110, 112, 108 of cluster tool 100 to form one or more films on the substrate. The substrate is then removed from cluster tool 100 and placed in a lithography tool to pattern a mask layer on the substrate. The substrate may then be placed into cluster tool 150. One or more etch processes are then performed on the substrate by one or more of process chambers 152, 154, 156 of cluster tool 150 to etch the film or films. Feedback engine 121 of controller 170 and/or of server 145 may receive optical measurement data before, during and/or after the etch process(es), and may use correlation model 123 to determine a film quality value of the film and/or to determine a process parameter value of a process parameter (or process parameter values of multiple process parameters) of a manufacturing process performed by one of the process chambers of cluster tool 100 to form the film. Feedback engine 121 may determine an offset or adjustment to apply to the process chamber that performed the earlier manufacturing process, and server 145 may send the offset or adjustment to controller 120. Controller 120 may store the offset or adjustment for the process chamber, and may cause the process chamber to use the offset or adjustment for future runs of a process used to form the film.

In one embodiment, the process chambers of cluster tool 100 are configured to perform one or more DRAM bit line stack processes (e.g., for post poly plug fabrication). Alternatively, the cluster tool 100 may be configured to perform other processes. Additionally, in one embodiment, the process chambers of cluster tool 150 are configured to perform one or more etch processes to etch one or more films of the DRAM bit line stack formed in the process chambers of cluster tool 100. In one embodiment, a lithography process is performed to pattern a hard mask layer deposited on top of the DRAM bit line stack prior to performance of the etch process(es).

Figure 2:
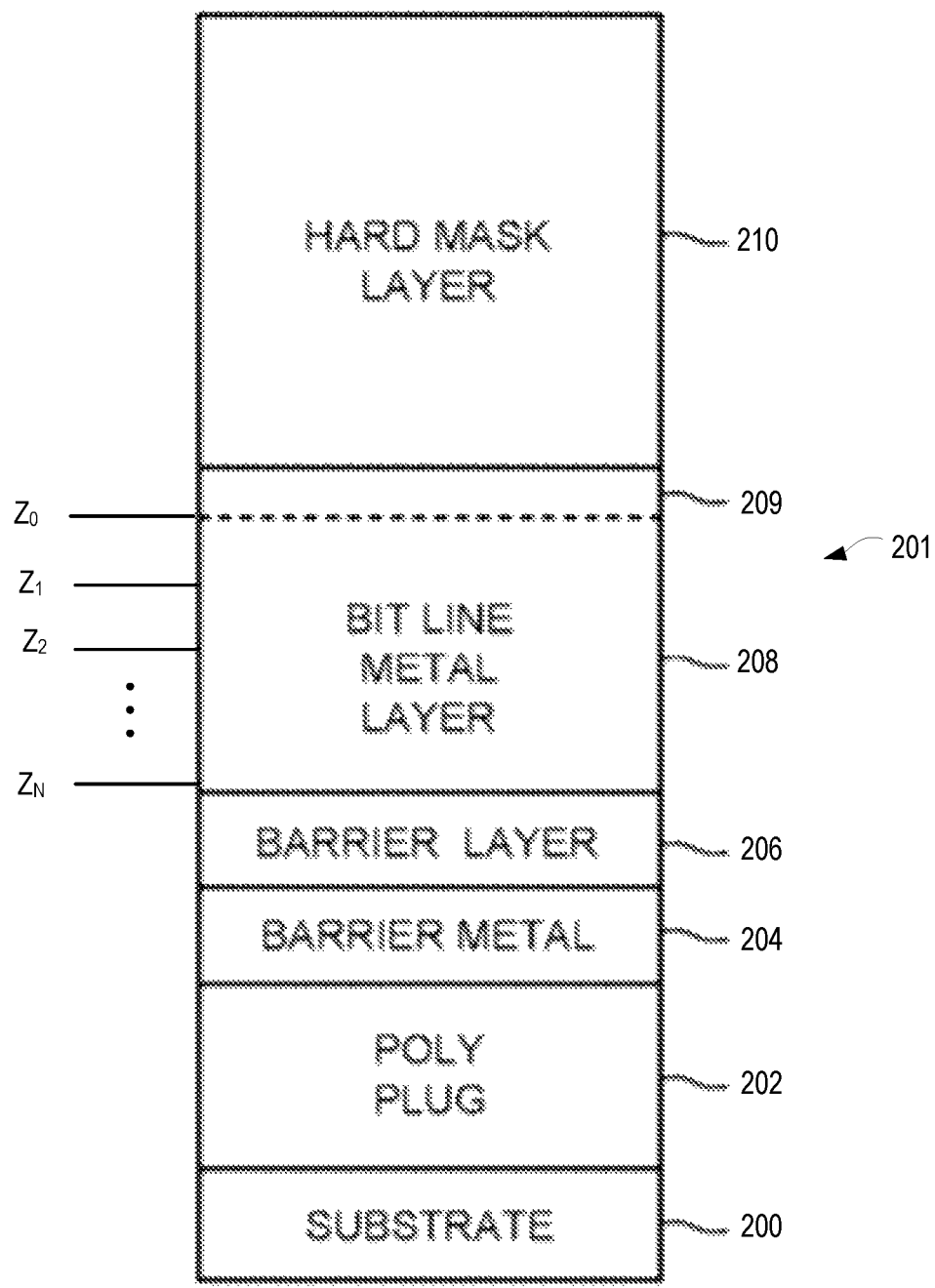
FIG. 2 shows a schematic side view of a portion of a substrate including a poly plug, a DRAM bit line stack, and a hard mask layer, in accordance with an embodiment.

For illustrative purposes, FIG. 2 shows a schematic side view of a portion of a substrate 200 including a poly plug 202, a DRAM bit line stack 201 (including a barrier metal 204, a barrier layer 206, and a bit line metal layer 208), and a hard mask layer 210. The poly plug 202 may have been formed by outside of cluster tool 100. The DRAM bit line stack 201 may have been formed inside of the cluster tool 100 without breaking a vacuum between deposition of the various layers of the DRAM bit line stack 201. Selective portions of the hard mask layer 210 may have been cured using a lithography process by a lithography tool.

In an example, processing chamber 106 may have been used to perform one or more pre-cleaning process to remove contaminants that may be present on the substrate 200, e.g., native oxidation that can be present on the substrate 200. The processing chamber 108 may have performed a barrier metal deposition process on the substrate 200 (e.g., to deposit a barrier metal 204 atop the cleaned substrate 200 and the poly plug 202). The barrier metal can be one of titanium (Ti) or tantalum (Ta), for example. The processing chamber 110 may have performed a barrier layer deposition process on the substrate 200 (e.g., to deposit a barrier layer 206 atop the barrier metal 204). The barrier layer 206 can be one of titanium nitride (TiN), tantalum nitride (TaN), or tungsten nitride (WN), for example. The processing chamber 112 may have performed a bit line metal deposition process on the substrate 200 (e.g., to deposit a bit line metal layer 208 atop the barrier layer 206). The bit line metal can be one of tungsten (W), molybdenum (Mo), ruthenium (Ru), iridium (Ir), or rhodium (Rh), for example. The processing chamber 114 may have performed a hard mask deposition process on the substrate 200 (e.g., to deposit a hard mask layer 210 atop the bit line metal layer 208). The hard mask can be one of silicon nitride (SiN), silicon oxide (SiO), or silicon carbide (SiC), for example. In some embodiments, an annealing process can be performed on the substrate 200 after deposition of the barrier layer 206 and prior to depositing the bit line metal layer 208 atop the barrier layer 206. The annealing process can be any suitable annealing process, such as a rapid thermal processing (RTP) anneal. Alternatively or in combination, an annealing process may have been performed on the substrate 200 after deposition of the bit line metal layer 208 and prior to depositing the hard mask layer 210 atop the bit line metal layer 208. An annealing process can be performed on the substrate 200 having the bit line metal layer 208 deposited thereon as discussed above. In some embodiments where the annealing process is performed, another processing chamber may have deposited an optional capping layer 209 deposited on the bit line metal layer 208 prior to formation of the hard mask layer 210. In some embodiments, the bit line metal is metals such as ruthenium (Ru) which are grain growth materials.

In one embodiment, the cluster tool 100 advantageously allows a user to perform a plurality of DRAM bit line processes on a poly plug using a single machine (e.g., a single cluster tool 100) that is configured to maintain a vacuum pressure environment throughout the entire DRAM bit line process. Accordingly, the likelihood of oxidation occurring on the substrate during post substrate 200 fabrication is reduced, if not eliminated. Additionally, since the vacuum pressure environment is maintained throughout the entire DRAM bit line formation process in embodiments, the choice of bit line metal materials is not limited by the grain growth characteristics of the metal.

After the DRAM bit line stack 201 and hard mask layer 210 have been formed, cluster tool 150 may perform one or more etch processes to etch one or more layers of the DRAM bit line stack 201. During one or more of the etch processes, optical measurements may be generated to determine instantaneous thicknesses of the layer or layers being etched. For example, during etching of the bit line metal layer 208, optical measurements may be generated at time $T_0$, $T_1$, $T_2$ though $T_N$. At time $T_0$, a thickness of $Z_0$ may be measured, at time $T_1$, a thickness of $Z_1$ may be measured, at time $T_2$, a thickness of $Z_2$ may be measured, and so on until the etch process is complete.

Once two or more thickness measurements are generated, the times at which those thickness measurements were made and the measured thicknesses may be used to compute an etch rate of a portion of the film between the two thicknesses. A thickness delta between the thickness values may be determined, and a time delta between the time values may be determined. The etch rate may then be the thickness delta divided by the time delta. For example, a first etch rate for the portion of the bit line metal layer 208 between $Z_0$ and $Z_1$ may be computed, a second etch rate for the portion of the bit line metal layer 208 between $Z_1$ and $Z_2$ may be computed, and so on. Each of the instantaneous etch rates associated with a region of the bit line metal layer 208 may be input into the correlation model of the feedback engine to determine a film quality value associated with that region of the bit line metal layer 208 as well as one or more process parameter values of one or more process parameters used during formation of the bit line metal layer 208. For example, the feedback engine may determine that a temperature of the substrate 200 during a start of deposition of the bit line metal layer 208 was too high and that a temperature of the substrate near an end of the deposition of the bit line metal layer 208 was too low. This information may be used to automatically determine one or more adjustments to make to a process recipe for future process runs. For example, a first temperature offset to reduce the temperature below a target temperature specified in a process recipe for the start of deposition of the bit line metal layer and a second temperature offset to increase the temperature above a target temperature specified in the process recipe for the end of deposition may be generated and stored for later application.

In additional to, or instead of, using the optical measurements and feedback engine to detect film quality and/or process parameter values of process parameters used during formation of the bit line metal layer 208, the optical measurements and feedback engine may be used to detect film quality and/or process parameter values of process parameters used during formation of other types of layers. Examples of other types of layers include the barrier layer, the barrier metal, and so on. In one embodiment, the feedback engine can determine film quality for any films for which the film quality correlates to etch rate. Similarly, in one embodiment, the feedback engine can determine process parameter values of process parameters used during a deposition process for which the process parameter values correlate to etch rate. The bit line metal layer (e.g., such as an Ru layer) is one example of a film whose film quality and process parameter values used during deposition correlate to etch rate.

Figure 3:
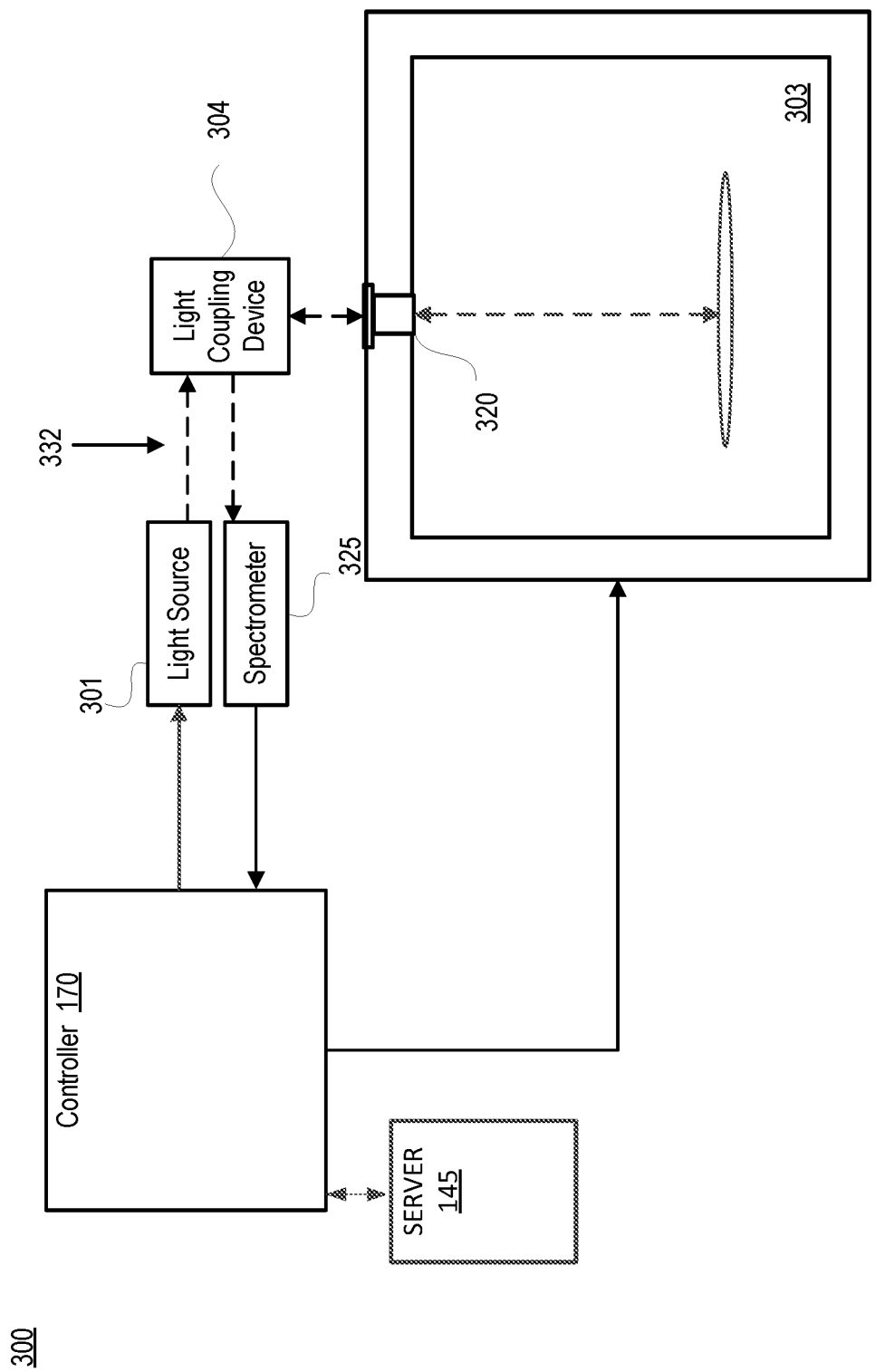
FIG. 3 is a simplified side view of an etch chamber and an optical sensor that performs in-line optical measurements associated with an etch process, according to an embodiment.

FIG. 3 illustrates a simplified side view of a system 300 for monitoring an etch processing chamber 303, according to one aspect of the disclosure. The system 300 may include, for example, the etch processing chamber 303. The processing chamber 303 may include a wall, lid, showerhead, nozzle, door, and/or other component that includes a window 320. The window 320 may be, for example, a transparent crystal. The transparent crystal may be made of transparent ceramic material, or may be made of a durable transparent material such as sapphire, diamond, quartz, silicon carbide, or a combination thereof.

In embodiments, the system 300 further includes a light source 301 (e.g., a broadband light source or other source of electromagnetic radiation), a light coupling device 304 (e.g., a collimator or a mirror), a spectrometer 325, the controller 170, and optionally the server 145. The light source 301 and spectrometer 325 may be optically coupled to the light coupling device 304 through one or more fiber optic cable 332.

In various embodiments, the light coupling device 304 may be adapted to collimate or otherwise transmit light in two directions along an optical path. A first direction may include light from the light source 301 that is to be collimated and transmitted into the processing chamber 303 through the window 320. A second direction may be a reflected light that has reflected off of a substrate 304 and back through the window 320 that passes back into the light coupling device 304. The reflected light may be focused into the fiber optic cable 332 and thus directed to the spectrometer 325 in the second direction along the optical path. Further, the fiber optic cable 332 may be coupled between the spectrometer 325 and the light source 301 for efficient transfer of light between the light source 301, to the transparent crystal 120, and back to the spectrometer 325.

In an embodiment, the light source emits light at a spectrum of about 200-800 nm, and the spectrometer 325 also has a 200-800 nm wavelength range. The spectrometer 325 may be adapted to detect a spectrum of the reflected light received from the light coupling device 304, e.g., the light that has reflected off of a substrate in chamber 303 and back through the window 320 and been focused by the light coupling device 304 into the fiber optic cable 332.

The controller 170 may be coupled to both the light source 301, the spectrometer 325, and the processing chamber 303.

In one embodiment, the controller 170 may direct the light source 301 to flash on and then receive a light spectrum from the spectrometer 325. The controller 170 may also keep the light source off and receive a second spectrum from the spectrometer 325 when the light source 301 is off. The processing device 130 may subtract the second spectrum from the first spectrum to determine the reflectometry signal for a moment in time. The controller 170 may then mathematically fit the reflectometry signal to one or more thin film models to determine one or more optical thin film property of a film that is measured.

In some embodiments, the one or more optical thin film property include film thickness, a refractive index (n), and/or an extinction coefficient (k) value. The refractive index is the ratio of the speed of light in a vacuum to the speed of light in the film. The extinction coefficient is a measure of how much light is absorbed in the film. The controller 170 may determine, using the n and k values, a composition of the film. The controller 170 may further be configured to analyze the data of the one or more property of the film. The controller 170 may then determine a film quality value and/or process parameter values as discussed herein above using a feedback engine. Alternatively, server 145 may determine a film quality value and/or process parameter values as discussed herein above using a feedback engine.

Figure 4A:
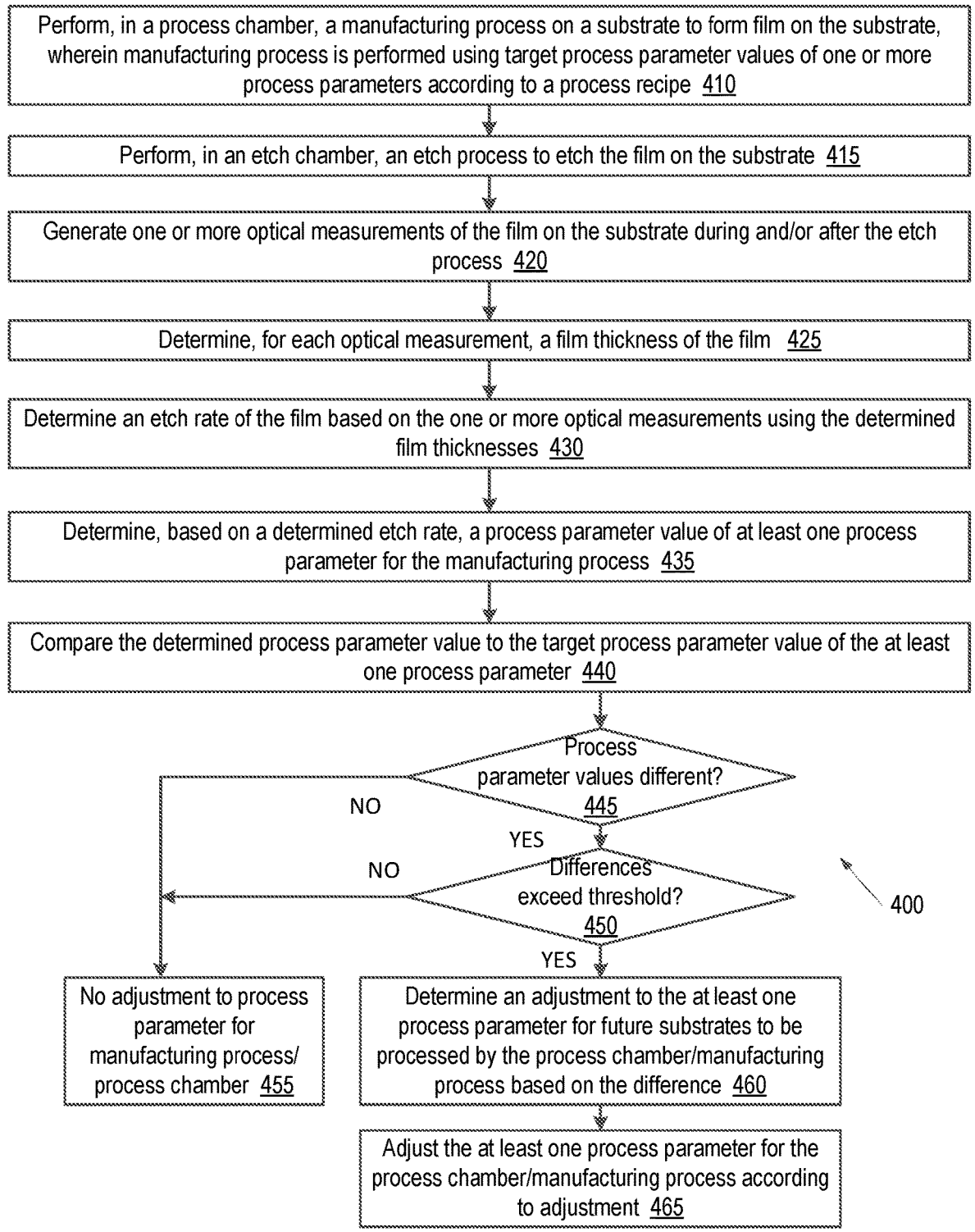
FIG. 4A is a flow chart for a method of performing feedback control of an upstream process based on optical measurements generated during and/or after an etch process, according to an embodiment.

FIG. 4A is a flow chart for a method 400 of performing feedback control of an upstream process based on optical measurements generated during and/or after an etch process, according to an embodiment. The method 400 may be performed with the components described with reference to FIGS. 1A-3, as will be apparent. For example, method 400 may be performed by controller 120, controller 170 and/or server 145 in embodiments. At least some operations of method 400 may be performed by a processing logic that may comprise hardware (e.g., circuitry, dedicated logic, programmable logic, microcode, etc.), software (e.g., instructions run on a processing device to perform hardware simulation), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are performed in every embodiment. Other process flows are possible.

At operation 410 of method 400, a processing chamber performs a manufacturing process on a substrate to form a film on the substrate. The processing chamber may be controlled by a controller (e.g., controller 120 of FIG. 1A), which may cause the processing chamber to perform the manufacturing process. The substrate may or may not have one or more films already formed on the substrate. Accordingly, in some embodiments the film formed at operation 410 is formed over one or more other films on the substrate.

In some embodiments, the processing chamber is a deposition chamber, and the manufacturing process is a deposition process such as a CVD process, a PVD process, an ALD process, and so on. The manufacturing process may alternatively be an epitaxy process, an oxide growth (i.e., oxidation) process, or other type of process that forms a film. The manufacturing process is performed using target process parameter values of one or more process parameters according to a process recipe. The process recipe may include different target process parameter values at different time offsets into the manufacturing process. For example, the process recipe may include a first temperature, a first pressure and a first plasma power at a start of the process, may include a second temperature, a second pressure and/or a second plasma power at a middle of the process, and may include a third temperature, a third pressure and/or a third plasma power near an end of the process. Some target process parameter values may remain unchanged during the manufacturing process, while other target process parameter values may change periodically throughout the manufacturing process. In some instances, some or all process parameter values remain constant throughout the manufacturing process.

The manufacturing process may have been designed based on a DoE performed to determine optimal process parameter values to achieve a film with target properties. The DoE may have tested multiple different process parameter values for each of the process parameters of the process recipe, and based on the test results may have generated the process recipe with a particular combination of process parameter values of the process parameters for the recipe.

After method 410 is performed, the substrate may be moved out of the processing chamber (e.g., by a transfer chamber robot). The substrate may be moved into one or more further process chambers, in sequence (e.g., by the transfer chamber robot). The additional process chambers may be connected to a same transfer chamber or cluster tool as the processing chamber that performed operation 410. Alternatively, or additionally, one or more additional process chambers may not be connected to the transfer chamber and/or cluster tool as the process chamber that performed operation 410. In some instances, one or more additional manufacturing processes (e.g., one or more deposition processes) are performed on the substrate. For example, one or more deposition processes may be performed on the substrate to form one or more additional films (e.g., such as a mask layer) on the substrate. Accordingly, a film stack that includes multiple layers of films may be formed. One example of such a film stack is the DRAM bit line stack shown in FIG. 2. However, in other embodiments different film stacks may be formed or a single film may be formed.

In some embodiments, the substrate is transferred to a lithography tool, which may expose the substrate to a pattern. The substrate may include a mask layer (e.g., a hard mask layer) over the film formed at operation 410. The lithography tool may transfer a pattern to the mask layer by curing a photoresist layer (e.g., by exposing a portion of the photoresist layer to ultraviolet light or other light).

At operation 415, the substrate is transferred into an etch chamber. The etch chamber may be connected to a same transfer chamber and/or cluster tool as the process chamber that performed operation 410. Alternatively, the etch chamber may not be connected to the transfer chamber and/or cluster tool that the process chamber that performed operation 410 is connected to. For example, the etch chamber may be connected to a different cluster tool and/or to a different transfer chamber from the process chamber that performed operation 410. At operation 415, the etch chamber performs an etch process to etch the film on the substrate. The etch operation may additionally etch one or more additional films and/or layers on the substrate, such as a mask layer over the film (and optionally over one or more other films). The etch chamber may be controlled by a controller (e.g., controller 170 of FIG. 1B), which may cause the etch chamber to perform the etch process.

At operation 420, one or more optical sensors of the etch chamber generates one or more optical measurements of the film on the substrate. The optical measurements may be, for example, spectrometry measurements and/or reflectometry measurements, and may provide information usable to determine a depth or thickness of the film. The optical measurements may be generated, for example, using the optical sensor shown in FIG. 3 in some embodiments. The optical measurements may be generated periodically before, during and/or after the etch process. For example, optical measurements may be generated at a start of the etch process to determine an initial thickness of the film, and may then be generated at a periodic basis (e.g., every 5 seconds, every 10 seconds, every 15 seconds, or at some other interval) until the etch process is complete. When the etch process is complete, the film may have a target final thickness, which in some instances may be a thickness of 0 nm (e.g., the film may be completely etched away at one or more regions of the substrate).

At operation 425, processing logic may process the optical measurements (e.g., using reflectometry and/or spectrometry) to determine a depth or thickness of the film. A different film thickness may be determined for each optical measurement.

At operation 430, processing logic may determine one or more etch rates (etch rates associated with particular depths into the film) for the film. In one embodiment, an etch rate is determined for the entire etch process based on a starting thickness, an ending thickness, a starting time and an ending time. In one embodiment, one or more instantaneous etch rates are determined for the film. Each instantaneous etch rate may be determined using two or more thickness measurements and the associated times at which the two or more thickness measurements were generated. Accordingly, different etch rates may be determined for different regions or depths of the film.

At operation 435, processing logic determines, based on at least one determined etch rate, a process parameter value of at least one process parameter for the manufacturing process that was used to form the film. In one embodiment, processing logic determines a process parameter value of a single process parameter that most closely correlates to a film quality. For example, the process parameter value may be a temperature value. In one embodiment, processing logic determines a combination of process parameter values for two or more process parameters that correlate to film quality. For example, the process parameter values may include a temperature value, a pressure value and/or a plasma power value. The process parameter value or values may be determined by inputting a determined etch rate into a trained model that has been trained to receive an etch rate as an input and to output one or more process parameter values. The model may be a trained regression model or a trained neural network, for example. Each of the determined etch rates may be input into the model to determine one or more process parameter values for the manufacturing process that was performed to form the film. For example, the temperature of the substrate/film when the film was 10 nm thick, when the film was 20 nm thick, when the film was 30 nm thick and so on during the formation of the film may be determined.

At operation 440, processing logic compares the determined process parameter value (or values) to one or more target process parameter values of the at least one process parameters. Based on the comparison, processing logic may determine whether the determined process parameter values deviate from the target process parameter values, and may determine the delta or amount of any differences between the determined process parameter values and the target process parameter values. The target process parameter values may be process parameter set points of the process recipe that was used to form the film. For example, the process recipe may have a target temperature, a target pressure and/or a target plasma power. Additionally, the target temperature, target pressure and/or target plasma power (and/or other process parameter values) may change at different points in the recipe (e.g., at different time offsets into the recipe). In many instances, the process parameter values that are actually achieved by a process chamber during execution of a process recipe do not exactly correspond to the process parameter set points of the process recipe. However, heretofore there has been no commercially viable way to determine whether this was the case. Embodiments provide a technique to quickly determine whether process parameter values for a film formation process (e.g., a deposition process) deviate from those of a process recipe (and by how much the determined process parameter values deviate from the target process parameter values) based on measured etch rates in a downstream etch process. The determined process parameter values may represent the true process parameter values that were achieved during the film formation process as opposed to the process parameter values that should have been achieved (as set forth in the process recipe). Accordingly, at operation 440 processing logic may determine, for example, whether a temperature was too high or too low, whether a pressure was too high or too low and/or whether a plasma power was too high or too low.

At operation 445, processing logic determines whether the determined process parameter values differ from the target process parameter values. If the target and determined process parameter values do not differ, the method continues to operation 455, and processing logic determines that no adjustment to the process parameter for the manufacturing process when executed by the process chamber is to be made. If the target and determined process parameter values do differ, the method continues to operation 450.

At operation 450, processing logic determines whether the determined difference between the determined process parameter value(s) and the target process parameter value(s) meets or exceeds a difference threshold. If the difference meets or exceeds the difference threshold, the method continues to operation 460. If the difference is below the difference threshold, the method proceeds to operation 455, and processing logic determines that no adjustment to the process parameter for the manufacturing process when executed by the process chamber is to be made and/or that no maintenance is to be scheduled for the process chamber.

At operation 460, processing logic may determine an adjustment to at least one process parameter. The adjustment is associated with the manufacturing process and with the process chamber that ran the manufacturing process to form the film on the substrate that was etched and for which the etch rate was determined. At operation 465, processing logic may adjust at least one process parameter for the process chamber/process recipe combination (e.g., for the process chamber when executing the process recipe) according to the determined adjustment.

The adjustment may be implemented in the form of an offset, which may be associated with the process recipe and the process chamber. The target process parameter value(s) of the process recipe may not be changed in embodiments. Rather, in one embodiment processing logic generates the process parameter value offset. The process parameter value offset may be stored, and may be applied for the process recipe when the process recipe is executed by the process chamber. The process parameter offset may be a correction offset that is equal to the delta or difference that was determined at operation 440. For example, if the target temperature was 600° C. and the determined temperature was 612° C., then the determined offset may be −12° C. Therefore, when the process chamber next performs the process recipe to form the film on a new substrate, it will use a temperature of 600−12=588° C. This will result in an actual temperature of 600° C. since the process chamber was shown to run hot and to output a temperature of 612° C. when set to 600° C.

Note that multiple process parameter offsets may be generated for a single process recipe/process chamber combination. For example, a temperature offset of +2° C. may be generated for 1-20 seconds of the process recipe, a temperature offset of +1° C. may be generated for 21-100 seconds of the process recipe, and no temperature offset may be generated for a remainder of the process recipe. This offset combination may be generated, for example, for a process chamber that heats up slower than was expected at a time of process recipe design. In another example, a temperature offset of +5° C., a pressure offset of −1 mtorr, and a plasma power offset of +10 mWatt may be determined.

In some embodiments, if the difference exceeds the difference threshold at operation 450, maintenance is scheduled for the process chamber.

Figure 4B:
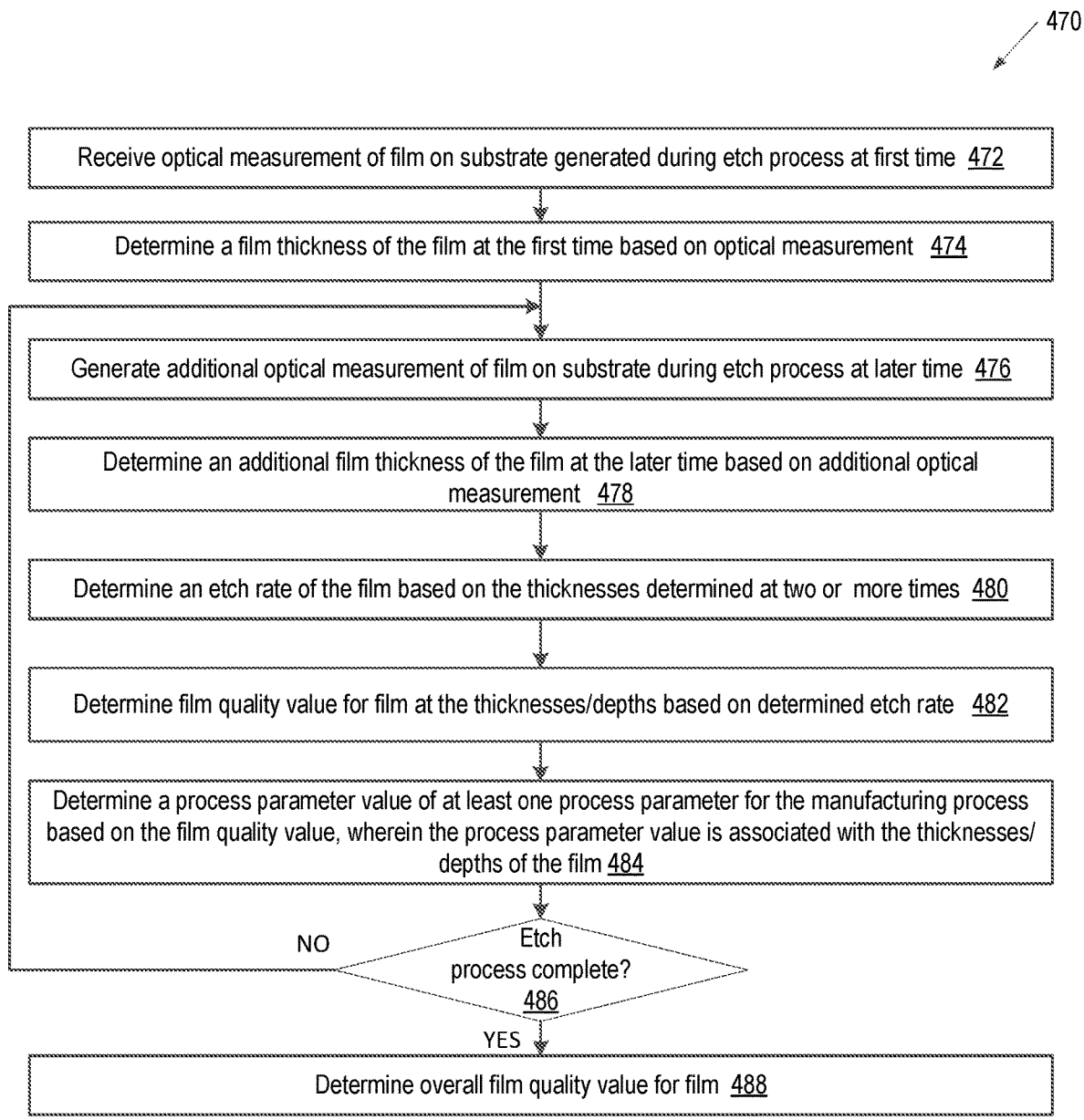
FIG. 4B is a flow chart for a method of determining process parameter values of one or more process parameters of an upstream process based on optical measurements generated during and/or after an etch process, according to an embodiment.

FIG. 4B is a flow chart for a method 470 of determining process parameter values of one or more process parameters of an upstream process based on optical measurements generated during and/or after an etch process, according to an embodiment. The method 470 may be performed with the components described with reference to FIGS. 1A-3, as will be apparent. For example, method 400 may be performed by controller 120, controller 170 and/or server 145 in embodiments. In one embodiment, method 470 is performed at operation 435 of method 400. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are performed in every embodiment. Other process flows are possible.

At operation 472 of method 470, processing logic receives an optical measurement of a film. The optical measurement may have been generated during an etch process at a first time (e.g., at time 0). At operation 474, processing logic determines a film thickness of the film at the first time based on the optical measurement (e.g., using reflectometry computations). At operation 476, processing logic generates an additional optical measurement of the film on the substrate during the etch process at a later time (e.g., at a second time, such as at time 10 seconds). At operation 478, processing logic determines an additional film thickness of the film at the later time based on the additional optical measurement.

At operation 480, processing logic determines an etch rate of the film based on the thicknesses determined at the two times. For example, processing logic may determine a change in thickness by subtracting the additional film thickness from the initial film thickness, and may determine a time difference by subtracting the later time from the first time. Processing logic may divide the change in thickness by the time difference to determine an instantaneous etch rate for the film between the initial thickness and the additional thickness.

At operation 482, processing logic determines a film quality value for the film at the thicknesses/depths in question based on the determined etch rate. In one embodiment, processing logic inputs the etch rate into a trained model, and the trained model outputs a film quality value. The film quality value may be a value that is correlated with one or more film properties that are associated with success and/or failure of final product. Some examples of film properties correlated with the film quality value are grain size (e.g., grain size in the Z direction or vertical direction profile), grain orientation, and average surface roughness. The film quality value may be used to estimate the quality of a final product that will include the film as one layer of the final product (e.g., a DRAM memory unit).

At operation 484, processing logic determines a process parameter value of at least one process parameter for the manufacturing process that was performed to form the film based on the film quality value and/or the etch rate. In one embodiment, the film quality value is input into another model that outputs the one or more process parameter values. In one embodiment, the trained model into which the etch rate is input outputs both the film quality value and the one or more process parameter values. The process parameter value(s) may correlate to both the film quality value and to the etch rate. The determined film quality value and the determined process parameter value(s) are associated with the particular region or thickness range of the film between the film thickness determined at operation 474 and the film thickness determined at operation 478.

At operation 486, processing logic determines whether the etch process is complete. If the etch process is not complete, the method returns to block 476, and an additional optical measurement is generated. This additional optical measurement may be used to determine another thickness, which may be used with a last determined thickness to determine a new etch rate for a new thickness range of the film. A new film quality value and/or new process parameter value(s) may then be determined for the new thickness range. This process may repeat, and new film quality values/process parameter values may be determined for each thickness range or region of the film until the etch process is complete. Depending on the characteristics of the film as more and more of the film is etched (e.g., using a directional or anisotropic etch or using an isotropic etch) and as deeper regions of the film are exposed, the etch rate may vary. For example, at some depths/thicknesses of the film it may have a large grain size, and at other depths/thicknesses of the film it may have a small grain size. A large grain size may be caused by increased temperature during the deposition process and may cause a lower density and etch more quickly, and a small grain size may be caused by decreased temperature during the deposition process and may cause a higher density and etch less quickly. Accordingly, as measurements of different depths of the film are performed, the film may have different properties and different instantaneous etch rates may be determined, which may correspond to different film quality values and/or process parameter values (e.g., temperatures).

At operation 488, processing logic optionally determines an overall film quality value for the film. The overall film quality value may be, for example, an average or median of the film quality values determined at the different thickness ranges of the film. The overall film quality value may be used to determine a probability that an end product will fail testing.

Figure 5:
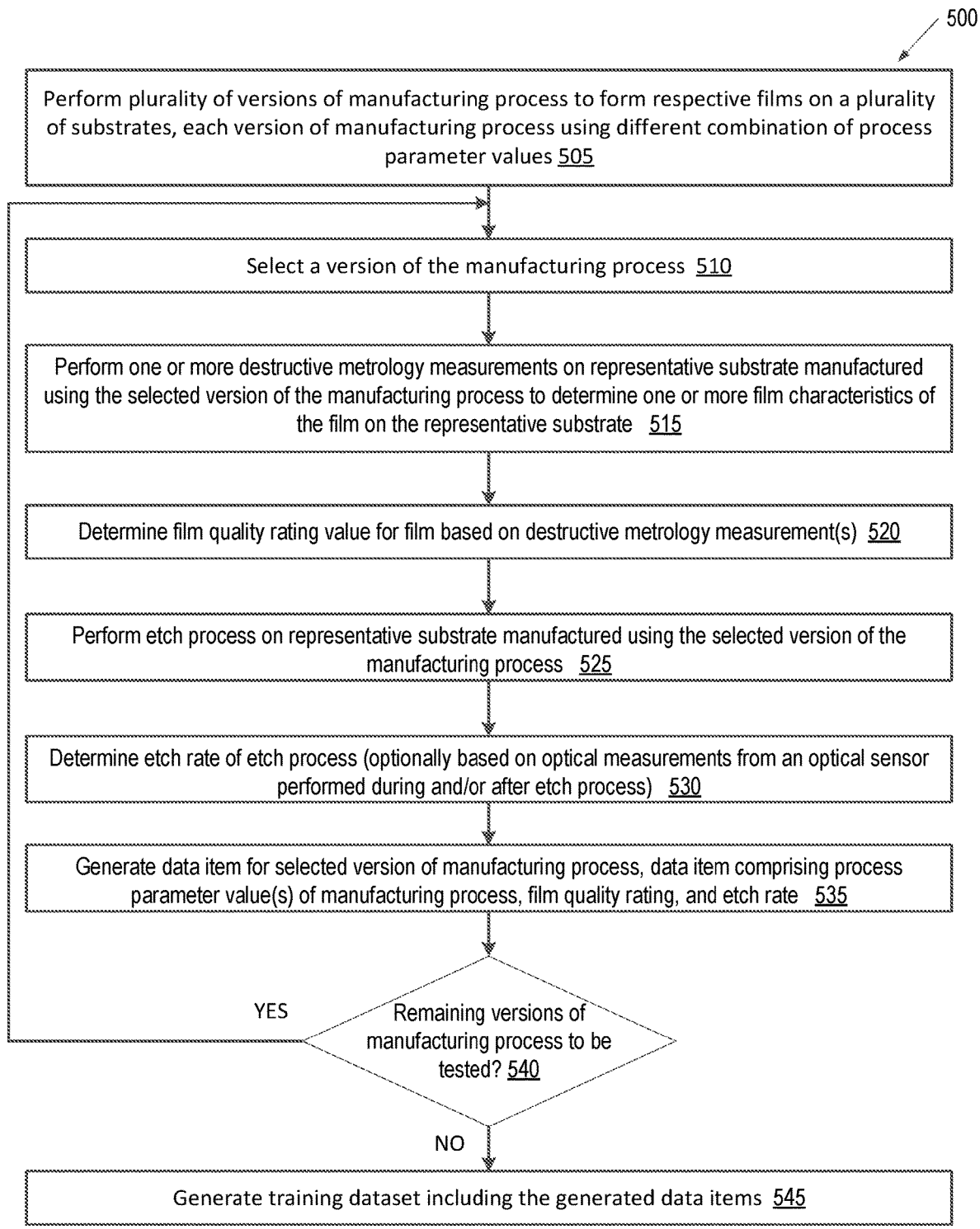
FIG. 5 is a flow chart for a method of performing a design of experiments (DoE) associated with a manufacturing process that forms a film on a substrate and a downstream etch process that etches the film, according to an embodiment.

FIG. 5 is a flow chart for a method 500 of performing a design of experiments (DoE) associated with a manufacturing process that forms a film on a substrate and a downstream etch process that etches the film, according to an embodiment. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are performed in every embodiment. Other process flows are possible.

At operation 505 of method 500, a plurality of versions of a manufacturing process (e.g., a deposition process) are performed. Each version of the manufacturing process uses a different combination of process parameter values and results in a film having different film properties. In one embodiment, each version of the manufacturing process uses a different temperature, and the other process parameters remain fixed for the different versions of the manufacturing process. In one embodiment, different versions of the manufacturing process have different settings for temperature, pressure and/or plasma power (e.g., of a plasma used during deposition, such as for plasma enhanced PVD or plasma enhanced CVD). In some instances, an optimal value for a process parameter may be known a priori, and that optimal value as well as one or more additional values of the process parameter that are above and below the optimal value may be tested. For example, for a manufacturing process with a known optimal temperature of 450° C., versions of the manufacturing process using the following temperatures may be tested: 435° C., 438° C., 441° C., 444° C., 447° C., 450° C., 453° C., 456° C., 459° C., 462° C. and 465° C. In one example, about 220 substrates are processed at a range of temperatures. For example, 20 wafers each may be processed at each of the above temperatures for a manufacturing process with a known optimal temperature of 450° C.

At operation 510, one of the versions of the manufacturing process is selected. At operation 515, one or more destructive metrology measurements are performed on a representative substrate manufactured using the selected version of the manufacturing process to determine one or more film characteristics of the film on the representative substrate. Examples of destructive metrology measurements that may be performed include electron backscatter diffraction (EBSD) and XRD. The destructive measurements may be performed to determine crystal characteristics and/or grain characteristics, such as grain size, grain orientation and/or average surface roughness (Ra). In one embodiment, EBSD and/or XRD measurements are performed to determine a grain size profile in a Z direction (vertical direction) for the film.

At operation 520, a film quality rating value is determined for the film based on the destructive metrology measurements. In one embodiment, optimal crystal characteristics and/or grain characteristics may be known. A film having the optimal crystal characteristics and/or grain characteristics may be assigned a particular film quality value (e.g., a film quality value of 0 or a film quality value of 100). The film may be assigned a film quality value based on an amount of deviation between the optimal crystal characteristics and/or grain characteristics and the measured crystal characteristics and/or grain characteristics of the film. In one embodiment, the film with the optimal crystal characteristics and/or grain characteristics has a highest film quality value. For example, if the film has a grain size that is larger or smaller than an optimal grain size, then the film may be assigned a value lower than the maximum based on an amount of difference between the optimal grain size and the grain size of the film. In one embodiment, the film with the optimal crystal characteristics and/or grain characteristics is associated with a middle film quality value. For example, 0 may be the optimal film quality value. In the example of grain size in the Z direction, films with a grain size that is larger than the optimal grain size may be assigned a positive film quality value, where the larger the value the further the deviation from optimal conditions. Similarly, films with a grain size that is smaller than the optimal grain size may be assigned a negative film quality value, where the larger the negative value the further the deviation from optimal conditions.

At operation 525, an etch process is performed on a representative substrate manufactured using the selected version of the manufacturing process. At operation 530, an etch rate is determined for the etch process (e.g., based on optical measurements from an optical sensor, where the optical measurements are performed before, during and/or after an etch process). In one embodiment, the etch rate is determined as described above. In one embodiment, the etch rate is calculated according to the equation ER $(n) = (Z_{n-1} - Z_n) *$ frequency, where ER is the etch rate, $Z_n$ is a particular thickness measurement, $Z_{n-1}$ is a previous thickness measurement, and frequency is the frequency at which thickness measurements are generated.

At operation 535, a data item is generated for the selected version of the manufacturing process. The data item may be a training data item that includes the process parameter value or values of the manufacturing process (e.g., the temperature used for the manufacturing process), the determined film quality rating, and the determined etch rate.

At operation 540, a determination is made as to whether there are remaining versions of the manufacturing process that have not yet been tested (and for which data items have not yet been generated). If there are still remaining untested versions of the manufacturing process, the method returns to operation 510, and a new version of the manufacturing process is selected to be tested. If all of the versions of the manufacturing process have been tested, the method continues to operation 545.

At operation 545, a training dataset is generated. The training dataset includes the data items generated for each of the versions of the manufacturing process. In some instances, the film quality rating for the respective versions of the manufacturing process (and associated respective versions of the film) after the destructive metrology has been performed on all of the versions of the film. This enables the differences between the film properties of each of the versions of the film to be compared before assigning film quality values.

Figure 6:
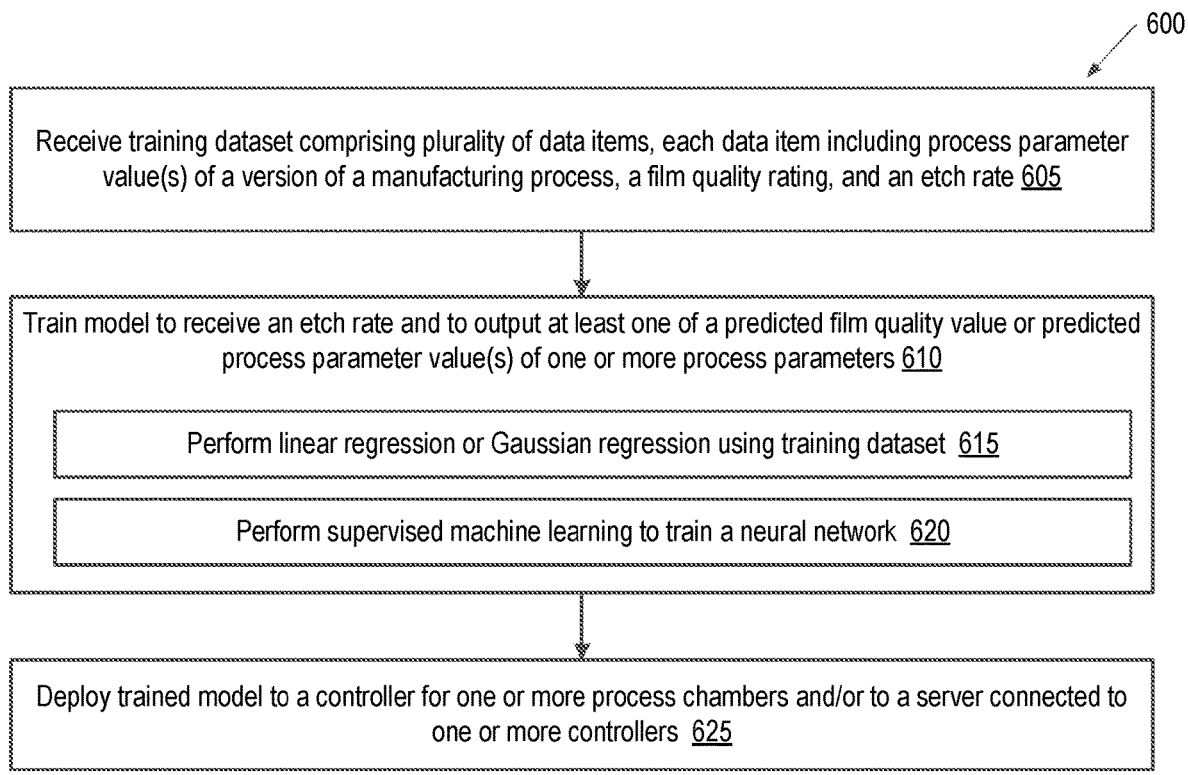
FIG. 6 is a flow chart for a method of training a model to determine, based upon an etch rate of a film measured during an etch process, a film quality value of the film and/or process parameter values of one or more process parameters of an upstream process that formed the film, according to an embodiment.

FIG. 6 is a flow chart for a method 600 of training a model to determine, based upon an etch rate of a film measured during an etch process, a film quality value of the film and/or process parameter values of one or more process parameters of an upstream process that formed the film, according to an embodiment. The method 600 may be performed with the components described with reference to FIGS. 1A-3, as will be apparent. For example, method 600 may be performed by controller 120, controller 170 and/or server 145 in embodiments. At least some operations of method 400 may be performed by a processing logic that may comprise hardware (e.g., circuitry, dedicated logic, programmable logic, microcode, etc.), software (e.g., instructions run on a processing device to perform hardware simulation), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are performed in every embodiment. Other process flows are possible.

At operation 605 of method 600, processing logic receives a training dataset (e.g., which may have been generated according to method 500). The training dataset may include a plurality of data items, where each data item includes one or more process parameter values of a version of a manufacturing process, a film quality rating, and an etch rate.

At operation 610, processing logic trains a model to receive an etch rate as an input and to output at least one of a predicted film quality value or a predicted process parameter value of a process parameter (or combination of predicted process parameter values of multiple process parameters).

In one embodiment, the model is a machine learning model such as a regression model trained using regression. Examples of regression models are regression models trained using linear regression or Gaussian regression. In one embodiment, at operation 615 processing logic performs linear regression or Gaussian regression using the training dataset to train the model. A regression model predicts a value of Y given known values of X variables. The regression model may be trained using regression analysis, which may include interpolation and/or extrapolation. In one embodiment, parameters of the regression model are estimated using least squares. Alternatively, Bayesian linear regression, percentage regression, leas absolute deviations, nonparametric regression, scenario optimization and/or distance metric learning may be performed to train the regression model.

In one embodiment, the model is a machine learning model, such as an artificial neural network (also referred to simply as a neural network). The artificial neural network may be, for example, a convolutional neural network (CNN). In one embodiment, at operation 620 processing logic performs supervised machine learning to train the neural network.

Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). The neural network may be a deep network with multiple hidden layers or a shallow network with zero or a few (e.g., 1-2) hidden layers. Deep learning is a class of machine learning algorithms that use a cascade of multiple layers of nonlinear processing units for feature extraction and transformation. Each successive layer uses the output from the previous layer as input. Neural networks may learn in a supervised (e.g., classification) and/or unsupervised (e.g., pattern analysis) manner. Some neural networks (e.g., such as deep neural networks) include a hierarchy of layers, where the different layers learn different levels of representations that correspond to different levels of abstraction. In deep learning, each level learns to transform its input data into a slightly more abstract and composite representation.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and back-propagation to tune the weights of the network across all its layers and nodes such that the error is minimized. In many applications, repeating this process across the many labeled inputs in the training dataset yields a network that can produce correct output when presented with inputs that are different than the ones present in the training dataset. In high-dimensional settings, such as large images, this generalization is achieved when a sufficiently large and diverse training dataset is made available.

In embodiments, the inputs are feature vectors including etch rate, and the labels are process parameter value(s) and/or film quality values. In one embodiment, the neural network is trained to receive an etch rate as an input and to output both a film quality value and a process parameter value (or set of two or more process parameter values). In one embodiment, the neural network is trained to receive an etch rate as an input and to output a film quality value. The film quality value may then be input into another trained model (e.g., another trained machine learning model), which may output a process parameter value of a process parameter or process parameter values of multiple process parameters. In one embodiment, the neural network is trained to receive an etch rate as an input and to output a process parameter value of a process parameter or process parameter values of multiple process parameters.

At operation 625, the trained model is deployed. The trained model may be deployed to a controller of one or more process chambers and/or cluster tools, for example. Additionally, or alternatively, the trained model may be deployed to a server connected to one or more controllers (e.g., to controllers of one or more process chambers and/or of one or more cluster tools). Deploying the trained model may include saving the trained model in a feedback engine of the controller and/or server. Once the trained model is deployed, the controller and/or server may use the trained model to perform feedback control of one or more manufacturing processes performed to form a film based on measured etch rates measured during etching of the film.

Figure 7:
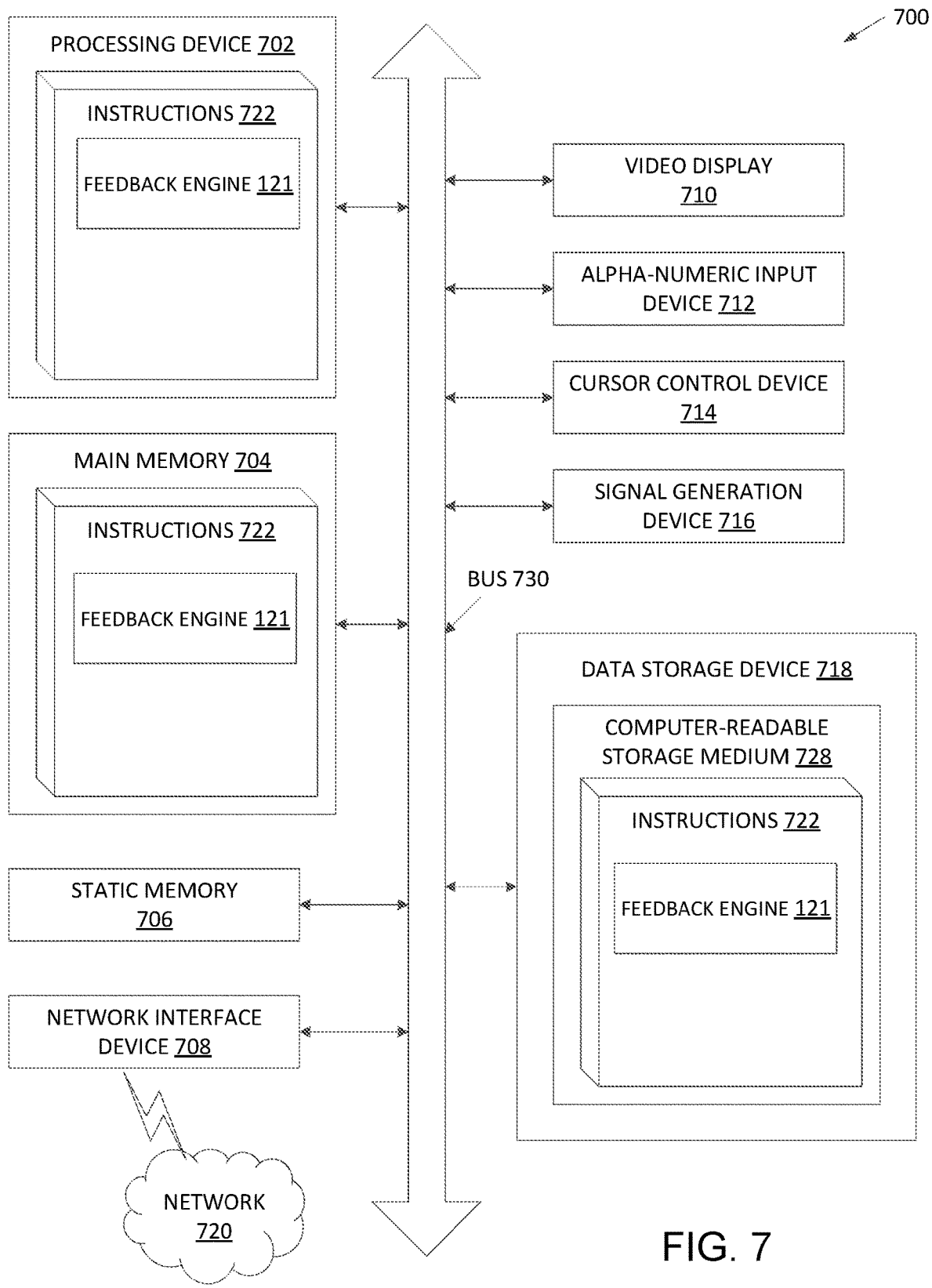
FIG. 7 illustrates a diagrammatic representation of a machine in the example form of a computing device within which a set of instructions, for causing the machine to perform any one or more of the methodologies discussed herein, may be executed.

FIG. 7 illustrates a diagrammatic representation of a machine in the example form of a computing device 700 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The example computing device 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory (e.g., a data storage device 718), which communicate with each other via a bus 730.

Processing device 702 represents one or more general-purpose processors such as a microprocessor, central processing unit, or the like. More particularly, the processing device 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. Processing device 702 is configured to execute the processing logic (instructions 722) for performing the operations and steps discussed herein.

The computing device 700 may further include a network interface device 708. The computing device 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The data storage device 718 may include a machine-readable storage medium (or more specifically a computer-readable storage medium) 728 on which is stored one or more sets of instructions 722 embodying any one or more of the methodologies or functions described herein. The instructions 722 may also reside, completely or at least partially, within the main memory 704 and/or within the processing device 702 during execution thereof by the computer system 700, the main memory 704 and the processing device 702 also constituting computer-readable storage media.

The computer-readable storage medium 728 may also be used to store a feedback engine 121, and/or a software library containing methods that call a feedback engine 121. While the computer-readable storage medium 728 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies described herein. The term "computer-readable storage medium" shall accordingly be taken to include, but not be limited to, non-transitory computer readable media such as solid-state memories, and optical and magnetic media.

The modules, components and other features described herein (for example in relation to FIGS. 1A-3) can be implemented as discrete hardware components or integrated in the functionality of hardware components such as ASICS, FPGAs, DSPs or similar devices. In addition, the modules can be implemented as firmware or functional circuitry within hardware devices. Further, the modules can be implemented in any combination of hardware devices and software components, or only in software.

Some portions of the detailed description have been presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a target result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving", "identifying", "determining", "selecting", "providing", "storing", or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the discussed purposes, or it may comprise a general purpose computer system selectively programmed by a computer program stored in the computer system. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic disk storage media, optical storage media, flash memory devices, other type of machine-accessible storage media, or any type of media suitable for storing electronic instructions, each coupled to a computer system bus.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A substrate processing system comprising:
   an etch chamber configured to perform an etch process on a substrate, wherein the etch chamber comprises an optical sensor to generate one or more optical measurements of a film on the substrate at least one of during the etch process or after the etch process; and
   a computing device operatively connected to the etch chamber, wherein the computing device is to:
   receive the one or more optical measurements of the film;
   determine, for each optical measurement of the one or more optical measurements, a film thickness of the film;
   determine an etch rate of the film based on the one or more optical measurements using the determined film thickness of each optical measurement of the one or more optical measurements;
   input the etch rate into a trained machine learning model, wherein the trained machine learning model outputs an estimated process parameter value of at least one process parameter for a previously performed process that was performed on the substrate prior to the etch process by a process chamber;
   determine that the estimated process parameter value of the at least one process parameter provided by the process chamber for the previously performed process had a deviation from a target process parameter value of the at least one process parameter; and
   adjust an operation of the process chamber by correcting the deviation between the estimated process parameter value and the target process parameter value for future execution of the previously performed process on the process chamber.

2. The substrate processing system of claim 1, wherein in order to determine the estimated process parameter value of the at least one process parameter for the previously performed process that was performed on the substrate based on the etch rate, the computing device is further to:
   determine a film quality value for the film based on the etch rate; and
   determine the estimated process parameter value of the at least one process parameter based on the film quality value.

3. The substrate processing system of claim 2, wherein the film quality value is a value associated with at least one of grain size, grain orientation, or average surface roughness of the film.

4. The substrate processing system of claim 1, wherein the optical sensor comprises a spectrometer configured to measure the film thickness using reflectometry.

5. The substrate processing system of claim 1, wherein the one or more optical measurements of the film comprise a plurality of optical measurements of the film, and wherein the computing device is further to:
   periodically determine, based on time stamps and film thickness values associated with two or more optical measurements of the plurality of optical measurements, an instantaneous etch rate for a region of the film.

6. The substrate processing system of claim 1, wherein the previously performed process comprises a deposition process, and wherein the at least one process parameter for the previously performed process comprises temperature.

7. The substrate processing system of claim 6, wherein the at least one process parameter for the previously performed process further comprises at least one of pressure or plasma power.

8. A method comprising:
   performing an etch process to etch a film on a substrate, wherein the film was previously formed on the substrate using a prior deposition process that was performed prior to the etch process;
   generating one or more optical measurements of the film on the substrate at least one of during the etch process or after the etch process;
   determining, for each optical measurement of the one or more optical measurements, a film thickness of the film;
   determining an etch rate of the film based on the one or more optical measurements using the determined film thickness of each optical measurement of the one or more optical measurements;

inputting the etch rate into a trained machine learning model, wherein the trained machine learning model outputs a determined process parameter value of at least one process parameter for the prior deposition process that was performed on the substrate prior to the etch process; and adjusting an operation of a process chamber that performed the prior deposition process with respect to future performance of the prior deposition process based on a difference between the determined process parameter value and a target process parameter value.

9. The method of claim 8, wherein determining the process parameter value of the at least one process parameter for the prior deposition process that was performed on the substrate based on the etch rate comprises:

determining a film quality value for the film based on the etch rate; and determining the process parameter value of the at least one process parameter based on the film quality value.

10. The method of claim 9, wherein the film quality value is a value associated with at least one of grain size, grain orientation, or average surface roughness of the film.

11. The method of claim 8, further comprising:

determining the difference between the determined process parameter value and the target process parameter value of the at least one process parameter;

determining the process chamber that performed the prior deposition process on the substrate; and determining an adjustment to the at least one process parameter for future substrates to be processed by the process chamber based on the difference.

12. The method of claim 8, wherein the one or more optical measurements of the film comprise a plurality of optical measurements of the film, the method further comprising:

periodically determining, based on time stamps and film thickness values associated with two or more optical measurements of the plurality of optical measurements, an instantaneous etch rate for a region of the film.

13. The method of claim 8, wherein the at least one process parameter for the prior deposition process comprises temperature.

14. The method of claim 13, wherein the at least one process parameter for the prior deposition process further comprises at least one of pressure or plasma power.

* * * * *